United States Patent
Zwez et al.

(10) Patent No.: US 6,355,395 B1
(45) Date of Patent: Mar. 12, 2002

(54) PHOTOPOLYMERIZABLE PRINTING PLATES WITH TOP LAYER FOR PRODUCING RELIEF PRINTING PLATES

(75) Inventors: Thomas Zwez, Karlsruhe; Stefan Wegener, Mainz, both of (DE)

(73) Assignee: BASF Drucksysteme GmbH, Stuttgart (DE)

( * ) Notice: Subject to any disclaimer, the term of this patent is extended or adjusted under 35 U.S.C. 154(b) by 0 days.

(21) Appl. No.: 09/458,844

(22) Filed: Dec. 13, 1999

(30) Foreign Application Priority Data

Dec. 23, 1998 (DE) .......................... 198 59 623

(51) Int. Cl.⁷ ............................. G03F 7/004; G03C 1/76
(52) U.S. Cl. ................................. 430/271.1; 430/273.1; 430/281.1; 430/302
(58) Field of Search ..................... 430/273.1, 281.1, 430/286.1, 287.1, 306

(56) References Cited

U.S. PATENT DOCUMENTS

| | | | |
|---|---|---|---|
| 3,431,323 A | 3/1969 | Jones .......................... 260/880 |
| 3,884,693 A | 5/1975 | Bauer et al. .................... 96/15 |
| 4,167,510 A | 9/1979 | Brendle ....................... 260/174 |
| 4,323,636 A | 4/1982 | Chen .......................... 430/271 |
| 4,323,637 A | 4/1982 | Chen .......................... 430/271 |
| 4,369,246 A | 1/1983 | Chen .......................... 430/306 |
| 4,387,157 A | 6/1983 | Bronstert .................... 430/271 |
| 4,423,135 A | 12/1983 | Chen .......................... 430/271 |
| 4,994,344 A | 2/1991 | Kurtz et al. .................. 430/273 |
| 5,370,968 A | * 12/1994 | Goss et al. ................... 430/271 |
| 5,804,353 A | * 9/1998 | Cushner et al. .............. 430/306 |
| 5,863,704 A | * 1/1999 | Sakurai et al. ........... 430/271.1 |
| 5,925,490 A | * 7/1999 | Loerzer et al. .............. 430/156 |
| 6,037,102 A | * 3/2000 | Loerzer et al. .............. 430/306 |
| 6,238,837 B1 | * 5/2001 | Fan ......................... 430/273.1 |

FOREIGN PATENT DOCUMENTS

| | | |
|---|---|---|
| CA | 2047302 | 1/1992 |
| DE | 24 56 439 | 8/1976 |
| DE | 28 23 300 | 12/1979 |
| EP | 84 851 | 8/1983 |
| EP | 456336 | 11/1991 |
| EP | 470 071 | 2/1992 |
| WO | WO 94/03838 | 2/1994 |

OTHER PUBLICATIONS 198 46 529 =BASF 0087/00018 DE.

* cited by examiner

Primary Examiner—Janet Baxter
Assistant Examiner—Barbara Gilmore
(74) Attorney, Agent, or Firm—Keil & Weinkauf

(57) ABSTRACT

A photopolymerizable printing plate has a dimensionally stable support, a photopolymerizable layer, a top layer located thereon comprising two mutually incompatible, elastomeric block copolymers, and a protective sheet. Disclosed are processes for producing such a photopolymerizable printing plate, processes for producing relief printing plates, especially flexographic printing plates, and also relief printing plates having ink cells in the relief surface.

11 Claims, 4 Drawing Sheets

Flexographic printing plate with top layer according to the invention

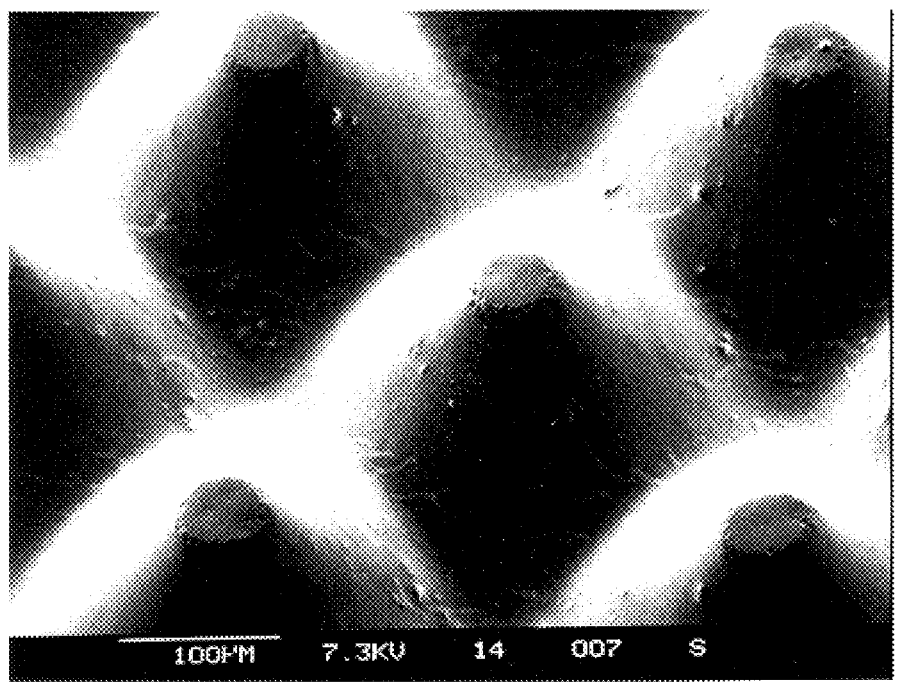
Figure 1: Flexographic printing plate without a top layer

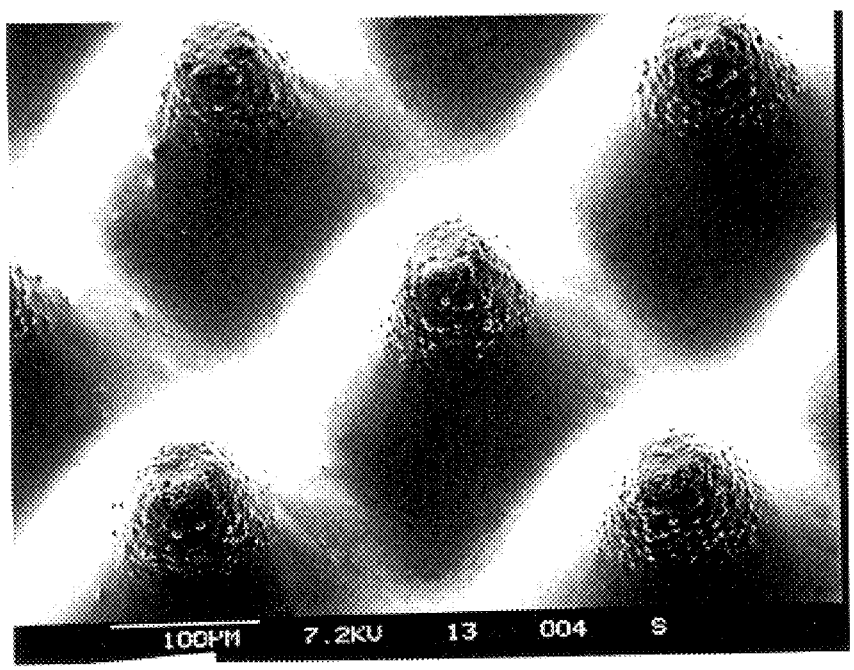
Figure 2: Flexographic printing plate with prior art top layer

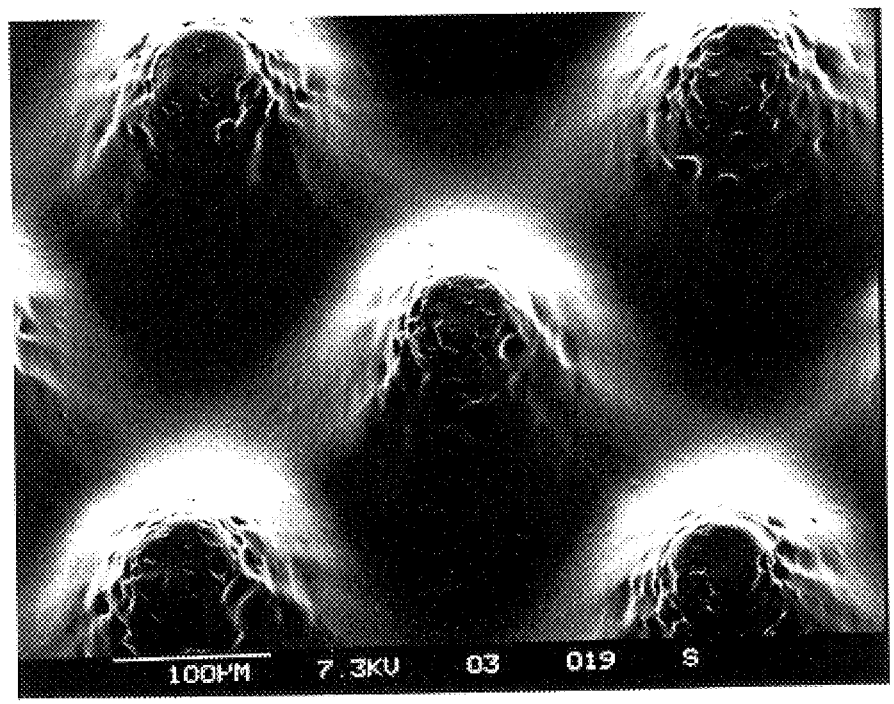
Figure 3: Flexographic printing plate with top layer according to the invention

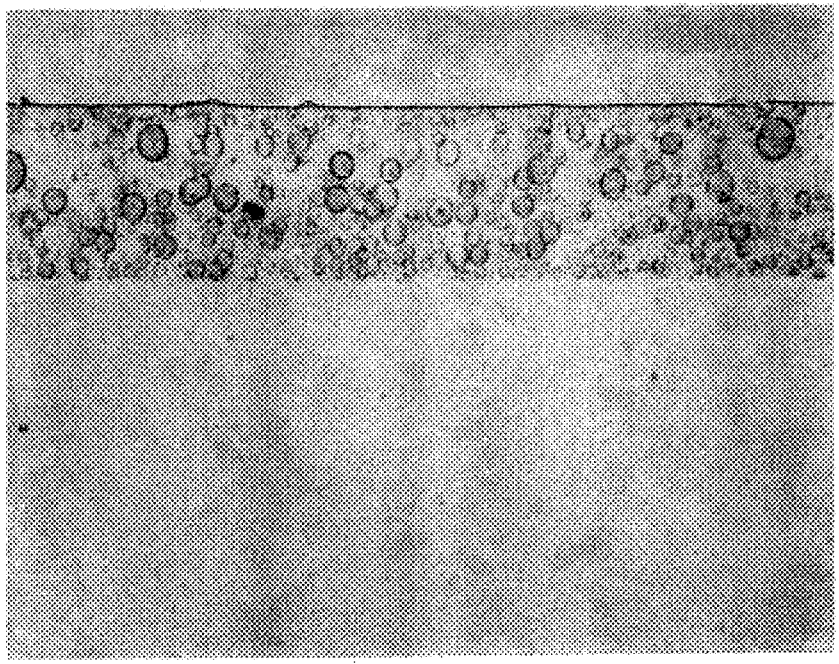
Figure 4: Section trough top layer of photopolymerizable flexographic printing plate according to the invention (280:1)

PHOTOPOLYMERIZABLE PRINTING PLATES WITH TOP LAYER FOR PRODUCING RELIEF PRINTING PLATES

The present invention relates to a photopolymerizable printing plate having a dimensionally stable support, a photopolymerizable layer, a top layer located thereon, and a protective sheet, said top layer comprising two mutually incompatible elastomeric block copolymers. It further relates to a process for producing such a photopolymerizable printing plate, to a process for producing relief printing plates, especially flexographic printing plates, and also to relief printing plates having ink cells in the relief surface.

Photopolymerizable printing plates are fundamentally known and generally feature a photopolymerizable layer which comprises a polymeric binder, a photopolymerizable compound, and a photopolymerization initiator or initiator system, with or without further customary constituents. For the production of flexographic printing plates preference is usually given to elastomeric binders such as block copolymers, examples being triblock copolymers with styrene-isoprene-styrene blocks or styrene-butadiene-styrene blocks, as described for example in DE-A 22 15 090. Printing plates comprising these elastomers as binders are soft and elastic and are therefore highly suitable for use in flexographic printing.

The printing properties are critically influenced by the surface of the printing plate. Parameters such as roughness, abrasiveness, surface tension, surface tack and solvent resistance have a great influence on ink transfer and the impression characteristics. It is known to construct printing plates from a plurality of layers, especially two layers. The two-layer construction of a printing plate, comprising a photopolymerizable layer and a relatively thin top layer located thereon, has the advantage that the properties of the surface of the printing plate can be modified without affecting the typical flexo properties of the printing plate such as, for example, hardness or elasticity. Surface properties and layer properties can therefore be modified independently of one another in order to achieve the optimum printing result.

EP-A 084 851 discloses a process for producing a photopolymerizable printing plate having a top layer. First of all, a so-called cover element is produced by applying the top layer to a cover film by casting or extrusion. Thereafter, a hot, extruded photopolymer composition is passed into the nip of a calender and calendered between a support and the cover element, so forming a photopolymerizable layer between them. The top layer comprises an elastomeric binder and optionally a second, nonelastomeric binder, especially a methyl methacrylate-acrylonitrile-butadiene-styrene tetrapolymer.

EP-A 456 336 discloses a photopolymerizable printing element having a top layer comprising as binder two elastomeric polymers: a crosslinking block copolymer and one which can be an acrylonitrile-butadiene or acrylonitrile-isoprene copolymer, carboxylated acrylonitrile, or a polyacrylate.

DE-A 40 22 978 discloses a photopolymerizable printing plate having a disadhesive top layer comprising a radial (polystyrene/polybutadiene)$_4$Si block copolymer and optionally, further, a methyl methacrylate-acrylonitrile-butadiene-styrene tetrapolymer. The top layer formed in this way is intended to prevent the image mask from sticking fast to the surface of the plate during exposure.

On exposure of the photopolymerizable printing plates, the acrylonitrile-containing polymers are incorporated by crosslinking in the form of small beads into the top layer, so that the surface of the printing relief of the polymerized and developed printing plate is populated with small beads.

Following exposure, the printing plates described are developed using chlorinated solvents such as tetrachloroethylene or mixtures of tetrachloroethylene and n-butanol. On ecological grounds, however, it is now common to use nonchlorine wash solutions based on high-boiling hydrocarbon solvents, as disclosed by EP-A 470 071, for example. However, the polymers containing acrylonitrile and methacrylate are largely insoluble in such solvents, with the result that polymer sludge is deposited in the washers, a consequence of which is increased cleaning effort.

In the interests of economic printing plate production, it is also required that the properties of the surface of a printing plate be able to be modified in a controlled and simple manner without the need for any great quantity or complexity of apparatus, in order to be able to tailor the surface individually for the particular intended application.

It is an object of the present invention to provide a photopolymerizable printing plate which has a top layer and can readily be developed using nonchlorine wash solutions. A further object is to provide a printing plate whose surface can be tailored individually and simply to the particular intended application yet is tack-free and exhibits outstanding ink acceptance.

We have found that these objects are achieved by a photopolymerizable printing plate having a dimensionally stable layer support, a photopolymerizable layer and an elastomeric top layer applied thereto, and a protective sheet.

In the printing plate of the invention the elastomeric top layer comprises
 40–95% by weight of a crosslinkable elastomeric block copolymer A comprising vinylaromatic blocks and diene blocks, and
 5–50% by weight of a noncrosslinkable elastomeric block copolymer B comprising vinylaromatic blocks and alkylene blocks,
said block copolymers A and B being mutally incompatible.

The invention also provides a relief printing plate having ink cells in the surface of the printing relief, said relief printing plate being preparable from a photopolymerizable printing plate of the type specified above. In general, said ink cells have a diameter and a depth of not more than 15 μm, preferably not more than 10 μm.

The relief printing plates of the invention having ink cells in the surface feature a tack-free surface and excellent ink acceptance. Their surface properties, especially their roughness, can be very simply and optimally adapted to the particular intended application.

The invention is also illustrated by the attached figures. FIGS. 1 to 3 show electron micrographs of individual screen dots of different flexographic printing plates.

FIG. 1 shows a flexographic printing plate without a top layer.

FIG. 2 shows a flexographic printing plate with a top layer, in accordance with the prior art, produced from a photopolymeric printing element having a top layer comprising an SIS block copolymer and a methyl methacrylate-acrylonitrile-butadiene-styrene tetrapolymer. The flexographic printing plate has beads in the surface.

FIG. 3 shows a flexographic printing plate having a top layer in accordance with the invention, produced from a photopolymeric printing element having a top layer comprising a crosslinking SIS block copolymer and a noncrosslinking SEBS block copolymer. The flexographic printing plate has ink cells in the surface.

FIG. 4 shows a section through the top layer of a photopolymerizable printing plate of the invention with domains of B in a continuous phase of A (scale 260:1).

In the photopolymerizable printing plate of the invention, a photopolymerizable layer is applied—with or without an adhesion layer—to a dimensionally stable support. Examples of suitable dimensionally stable supports are plates, films and also conical and cylindrical sleeves made from metals such as steel, aluminum, copper and nickel or from polymers such as polyethylene terephthalate (PET), polybutylene terephthalate, polyamide and polycarbonate, and, if desired, also wovens and nonwovens, such as glass fiber wovens, and also composite materials of glass fibers and polymers. Particularly suitable dimensionally stable supports are dimensionally stable support films, examples being polyethylene films or polyester films, especially polyethylene terephthalate films. These support films have a thickness of generally between 50 and 500 µm, preferably from 75 to 400 µm, for example, approximately 125 µm. The layer support can be underlaid with a soft and elastic underlayer.

For the adhesion layers it is possible, inter alia, to use polyurethane adhesion varnishes, in accordance, for example, with DE-A-30 45 516, based on polyisocyanate-crosslinking polyether varnishes or polyester varnishes in layer thicknesses of between 0.5 and 50 µm, in particular between 2 and 30 µm.

The photopolymerizable layer consists of a photopolymerizable mixture which works negatively, i.e., is hardened by exposure to light. This may be carried out by photo-crosslinking with ready-prepared polymers, by photopolymerization of photopolymerizable compounds of low molecular mass, or by both methods. Photopolymerizable layers contain essentially a polymeric binder which can be washed out in the developer, an ethylenically unsaturated, free-radically polymerizable compound, a photoinitiator or photoinitiator system, and, optionally, further additives and auxiliaries. The composition of such layers is known in principle and is described, for example, in DE-A 24 56 439 or EP-A 084 851.

The binders used are with particular advantage elastomers; for example, block copolymers having rigid polymer blocks of styrene, acrylonitrile or acrylic ester units and elastic blocks of diene polymers such as butadiene or isoprene, for example. Suitable examples are elastomeric triblock copolymers having styrene-isoprene-styrene or styrene-butadiene-styrene blocks, as described for example in DE-A 22 15 090. The triblock copolymers can be used as sole elastomers or else as a mixture with diblock copolymers, examples being styrene-isoprene and styrene-butadiene diblock copolymers. It is particularly advantageous to use triblock copolymers having terminal styrene blocks and an elastomeric middle block composed randomly of styrene and butadiene, as described in DE File Reference P 198 46 529.7.

The photopolymerizable mixtures further comprise, conventionally, polymerizable compounds, or monomers. The monomers are to be compatible with the binder and have at least one polymerizable ethylenic double bond. Suitable monomers generally have a boiling point of more than 100° C. at atmospheric pressure and a molecular weight of up to 3000 g/mol, preferably up to 2000 g/mol. Monomers which have been found particularly advantageous are esters or amides of acrylic or methacrylic acid, styrene or substituted styrenes, esters of fumaric or maleic acid, and allyl compounds. Suitable monomers are specified on page 5 of EP-A 326 977.

Suitable initiators for the photopolymerization include benzoin or its derivatives, such as α-methylbenzoin or benzoin ethers, benzil derivatives, such as benzil ketals, acylarylphosphine oxides, acrylarylphosphinic esters, polycyclic quinones, and benzophenones.

The photopolymerizable mixtures generally contain from 45 to 95% by weight of the binder based on the sum of all constituents. Preferably, from 70 to 95% by weight of the binder is employed. The amount of polymerizable monomers is from 4.9 to 45% by weight, preferably between 4.9 and 30% by weight. The amount of photoinitiator is from 0.1 to 5% by weight.

The photopolymerizable mixtures may further comprise plasticizers. Examples of suitable plasticizers are modified and unmodified natural oils and resins, alkyl, alkenyl, arylalkyl or arylalkenyl esters of acids, such as alkanoic acids, arylcarboxylic acids or phosphoric acid; synthetic oligomers or resins such as oligostyrene, oligomeric styrene-butadiene copolymers, oligomeric α-methylstyrene-p-methylstyrene copolymers, liquid oligobutadienes, or liquid oligomeric acrylonitrile-butadiene copolymers; and also polyterpenes, polyacrylates, polyesters or polyurethanes, polyethylene, ethylene-propylene-diene rubbers or α-methyloligo (ethylene oxide). Examples of particularly suitable plasticizers are paraffinic mineral oils; esters of dicarboxylic acids, such as dioctyl adipate or dioctyl terephthalate; naphthenic plasticizers or polybutadienes having a molar weight of between 500 and 5000 g/mol. It is also possible to use mixtures of different plasticizers. The amount of any plasticizer present is chosen by the skilled worker in accordance with the desired hardness of the printing plate. It is generally below 40% by weight based on the sum of all constituents of the photopolymerizable mixture.

The photopolymerizable mixtures may further include customary auxiliaries, especially inhibitors of heat-initiated polymerization, dyes, pigments, photochromic additives, antioxidants, antiozonants or extrusion aids. The amount thereof is generally less than 20% by weight based on the sum of all constituents of the photopolymerizable mixture, and is advantageously chosen so that the overall amount of plasticizer and auxiliaries does not exceed 50% by weight based on the sum of all the constituents.

Examples of inhibitors of heat-initiated polymerization are hydroquinone, p-methoxyphenol, 2,6-di-tert-butyl-p-cresol, β-naphthol, phenothiazine, pyridine, nitrobenzene, m-dinitrobenzene or chloranil; thiazine dyes, such as Thionine Blue G (C.I. 52025), Methylene Blue B (C.I. 52015) or Toluidine Blue (C.I. 52040); or N-nitrosamines.

Dyes or pigments can be added in an amount of up to 2% by weight and serve to control exposure properties, direct monitoring of the result of exposure, or esthetic ends. A precondition of the selection and amount of such additives is that, just like the inhibitors, they do not affect the photopolymerization of the mixtures. Particularly suitable are azo dyes, as disclosed for example in DE-A 42 02 332.

Examples of antioxidants are sterically hindered monophenols, such as 2,6-di-tert-butyl-p-cresol; alkylated thiobis- and alkylidenebisphenols; hydroxybenzyls, such as 1,3,5-trimethyl-2,4,6-tris(3,5-di-tert-butyl-4-hydroxybenzyl)-benzene; triazines; dilaurylthio dipropionate; or phosphites, such as tris(nonylphenyl) phosphite.

Examples of extrusion aids which can be used are α-methylstyrene-vinyltoluene copolymers.

Examples of antiozonants are the customary, known ozone protection waxes and also chloroalkanes containing 8 to 40 carbon atoms and from 30 to 73% by weight of chlorine in the molecule.

The thickness of the photopolymerizable relief-forming layer is governed primarily by the intended use of the photopolymerizable printing plates of the invention. For instance, the thickness varies generally from 0.05 to 7 mm, preferably from 0.1 to 7 mm, and in particular, from 0.7 to 6.5 mm. It is chosen by the skilled worker in accordance with the requirements of the particular desired application.

In the case of the photopolymerizable printing plate of the invention, an elastomeric top layer is applied on the photopolymerizable layer. The elastomeric top layer is either photopolymerizable itself or becomes photopolymerizable by virtue of its contact with the photopolymerizable layer.

The elastomeric top layer contains 40–95% by weight, based on the sum of all constituents of the top layer of a crosslinkable elastomeric block copolymer A comprising vinylaromatic blocks and diene blocks. The block copolymer A can be a diblock, triblock or other multiblock copolymer or a radial block copolymer. It is preferably a triblock copolymer having terminal vinylaromatic blocks and diene blocks in the middle. The vinylaromatic blocks can be composed, for example, of styrene, α-methylstyrene or alkyl-substituted styrenes, such as 4-methylstyrene, for example. The diene blocks can be composed of conjugated aliphatic diolefins, such as butadiene, alkyl-substituted butadienes, halo-substituted butadienes, or mixtures thereof. The diene blocks are preferably composed of butadiene or isoprene. It is possible, although not preferred, for the diene block to be partially hydrogenated. However, there must still be sufficient double bonds in the diene block to render the block copolymer A crosslinkable and incompatible with the block copolymer B. The elastomeric block copolymer A is preferably a triblock copolymer comprising polystyrene blocks and polybutadiene blocks or polyisoprene blocks. It is also possible to use mixtures of different block copolymers A.

The elastomeric top layer further contains 5–50% by weight of a noncrosslinkable elastomeric block copolymer B comprising vinylaromatic blocks and alkylene blocks, which is incompatible with the crosslinkable block copolymer A. Incompatible means that the two block copolymers are not homogeneously miscible with one another, but instead that the block copolymer B is distributed in the form of discrete domains or islands, consisting essentially of the block copolymer B, in a continuous phase consisting essentially of the block copolymer A. The diameter of said domains is generally not more than 15 $\mu$m, preferably 5–10 $\mu$m. The domains can be seen under the electron microscope as droplets or beads after the layer has undergone appropriate contrasting with, for example, $OsO_4$ (see FIG. 4). The block copolymers B are noncrosslinkable; in other words, they contain no significant amounts, if any at all, of polymerizable double bonds in the middle blocks.

The block copolymer B can be a diblock, triblock or other multiblock copolymer or a radial block copolymer. It is preferably a triblock copolymer having terminal vinylaromatic blocks and alkylene blocks in the middle. The vinylaromatic blocks can have the composition described above. The blocks comprising alkylene units can be prepared by polymerizing olefins, for example ethene, propene, 1-butene, 1-hexene and similar monoolefins, or by hydrogenating ready-prepared blocks of diene polymers, for example polybutadiene. The hydrogenation produces ethylene units or 1,2-butylene units depending on whether the butadiene units in the polymer have been formed by 1,2 or 1,4 addition. The hydrogenation can be carried out in a conventional manner as described, for example, in U.S. Pat. No. 3,431,323. The alkylene blocks are preferably polyethylene/propylene or polyethylene/butylene blocks. Such products are known and are available commercially. It is also possible to use mixtures of different block copolymers B.

The ratio of the amounts of the two block copolymers A and B in the top layer can be chosen within the aforementioned limits in accordance with the desired properties of the finished printing plate. In general, the ratio A/B is greater than 50:50. Preferably, the ratio A/B lies between 60:40 and 90:10, with particular preference between 70:30 and 85:15.

The elastomeric binders are, furthermore, advantageously chosen such that they are soluble or at least swellable in the developer for the photopolymerizable layer.

The top layer of the invention may further comprise polymerizable, ethylenically unsaturated monomers, and also photoinitiators or photoinitiator systems. In this context it is possible to use those compounds which are also used in the photopolymerizable layer. Furthermore, it may include further additives and auxiliariers, such as, for example, heat stabilizers, color pigments or dyes.

The top layer of the invention preferably includes a migration-stable dye or a migration-stable color pigment or preparations thereof. Examples of suitable color pigments are copper phthalocyanine (e.g. Sicodop® Blue) or perylene pigments (e.g. Paliogenrot®). The color pigments are generally used in the form of predispersed pigment preparations as a mixture with suitable dispersing auxiliaries and/or binders.

With particular preference, the top layer of the invention includes a migration-stable polymeric dye whose chromophore is either a constituent or end group of a polymer chain or is grafted as a side group onto a polymer chain. The polymeric dye is advantageously soluble in the wash solution. Particularly suitable polymeric dyes are those which can be represented by the formula Chr—$(X)_n$, where Chr is an organic chromophore and X is a branched or unbranched polyoxyalkylene chain. The chromophore is covalently bonded to the polymer via an anchor group. Examples of suitable anchor groups are atoms or groups such as —N<, —O—, —S—, —$SO_2$—, —$CO_2$—, —(CO)N< or —(CO)NH—. The polyoxyalkylene chain preferably comprises homopolymers or copolymers of ethyleneoxy, propyleneoxy or butyleneoxy units, with or without small amounts of further compatible monomers. n is the number of polymer chains per chromophore and may range from 1 to 6. Preferred organic chromophores are azo compounds. Polymeric dyes of this kind are fundamentally known. The synthesis is disclosed, for example, in U.S. Pat. No. 3,157,633 or U.S. Pat. No. 4,167,510. They are available commercially under the name Reactint® (from Milliken).

The amount of added dyes, color pigments and/or preparations thereof is governed by the particular intended application and by the desired properties. However, the amount of all added auxiliaries and additives should generally not exceed 5% by weight, preferably 3% by weight, based on all of the constituents of the top layer.

The top layer is generally thin as compared with the photopolymerizable layer. The thickness of the top layer is preferably 5–200 $\mu$m, with particular preference 20–150 $\mu$m.

In addition, the recording material of the invention commonly includes a transparent abhesive layer which is soluble or swellable in the developers of the photopolymer layer, adheres more strongly to the top layer than to the protective sheet, and is formed by a polymer which forms films of high tensile strength and by any additives present in said polymer. Examples of suitable polymers that form films of high tensile strength are polyamides, fully or partially hydrolyzed polyvinyl acetates or polyethylene oxide-vinyl acetate graft copolymers, copolyamides, polyurethanes, poly(meth)acrylates, polyvinyl alcohol alkanecarboxylic esters with a degree of hydrolysis of from 30 to 99%, cyclorubbers with a high degree of cyclization, ethylene-propylene copolymers, homopolymers and copolymers of vinyl chloride, or ethylene-vinyl acetate copolymers. Examples of suitable abhesive layers which comprise additives are known from DE-A 28 23 300 or DE-B 21 23 702. Generally speaking, the abhesive layers are from 0.2 to 25 µm thick. They make it easier to peel off the protective sheet without damaging underlying layers.

In one particular embodiment of the invention there is an IR-sensitive layer on the abhesive layer or, preferably, between the top layer and the abhesive layer. The IR-sensitive layer is IR-ablative; that is, it can be partially removed, i.e., subjected to imagewise inscription by irradiation with an IR laser, preferably a Nd/YAG laser. IR-sensitive layers of this kind are known, for example, from EP-A 767 407.

The IR-sensitive layer is soluble or dispersible in the developer and includes at least one finely divided substance having high absorption in the wavelength range between 750 and 20,000 nm, and an optical density of more than 2.5 in the actinic range, in a film-forming binder having elastomeric properties. Said developer can be based on water, on water/alcohol, or on organic solvents. Suitable binders for the IR-sensitive layer are addition polymers, especially copolymers which are soluble or dispersible in water and/or alcohol, or those which are soluble or dispersible in organic solvents or solvent mixtures.

Examples of binders soluble or dispersible in water or water/alcohol mixtures and having elastomeric properties are polyvinyl alcohol-polyethylene glycol copolymers (e.g. Mowiol® GE 5-97 from Hoechst), which are obtainable by grafting vinyl acetate onto polyethylene glycol with molecular weights of between 1000 and 50,000, and then hydrolyzing to a degree of hydrolysis between 80 and 100%.

Examples of binders soluble or dispersible in organic solvents or solvent mixtures and having elastomeric properties are thermoplastic elastomeric polyamide resins, which are obtainable commercially (e.g. Macromelt®, from Henkel). These products are described in detail in the respective company brochures.

Examples of the finely divided substances present in the film-forming binder of the IR-sensitive layer are various finely divided carbon blacks, examples being FarbruB FW 2000, Spezialschwarz 5 or Printex® U from Degussa, having an average primary particle size of from 13 to 30 nm.

The photopolymerizable printing plate is protected against mechanical damage by a protective sheet which is located on the topmost layer and consists, for example, of PET.

The photopolymerizable printing plate of the invention can be produced by producing a layer assembly comprising—in this order—a protective sheet, an abhesive layer, optionally an IR-ablative layer, and a top layer and applying it to a photopolymerizable layer on a dimensionally stable support. The photopolymerizable layer and the top layer are joined directly to one another in this arrangement; in other words, there is no further layer between the two layers. Although not restricted to this procedure, said application can be advantageously made in the manner known from EP-A 084 851, by passing a hot, extruded photopolymer composition into the nip of a calender and calendering it between a dimensionally stable support and the layer assembly.

The layer assembly can be produced by coating the protective sheet first with an abhesive layer and optionally with a IR-ablative layer. The abhesive layer is produced preferably by dissolving the tensile strength polymer in a suitable solvent, then pouring on the solution and evaporating the solvent. To produce the IR-ablative layer it is advantageous to use a solution of the binder containing the substances of high IR absorption homogeneously dispersed therein. This solution is either applied directly and uniformly to the abhesive layer and dried or poured onto a sheet and dried and the resulting layer then laminated, following removal of the sheet, onto the abhesive layer.

The top layer is applied by dissolving block copolymer A and block copolymer B and, optionally, additives, dyes, color pigments or preparations thereof in a suitable solvent or solvent mixture. Dissolution is advantageously assisted by intense mixing of the batch, using a suitable stirring or dispersing apparatus, and also, if desired, by heating. The solution is subsequently poured as a thin layer onto the protective sheet coated with an abhesive layer, or, if present, onto the IR-ablatable layer, and the solvent is subjected to controlled evaporation. In the course of the evaporation of the solvent, the two mutually incompatible block copolymers A and B separate, so forming the above-described structure of islands of the block copolymer B in a continuous phase of block copolymer A.

Suitable solvents for the two mutually incompatible block copolymers are aliphatic hydrocarbons, cycloaliphatic hydrocarbons such as cyclohexane, for example, aromatic hydrocarbons such as toluene, ethylbenzene or xylene, for example, and chlorinated hydrocarbons such as methylene chloride or chloroform, for example. It is also possible to use mixtures of different solvents. Furthermore, the mixtures may also include ketones such as methyl ethyl ketone, for example, or higher alcohols. Through the composition of the solvent mixture it is possible to control the size of the domains of block copolymer B. A particularly suitable solvent mixture is one comprising toluene and xylene.

The size of the domains of the block copolymer B in the continuous phase of block copolymer A can also be influenced by the drying rate. The drying of the layer should take place with sufficient rapidity that generally only small domains of B having a diameter of not more than 15 µm, preferably 5–10 µm, are obtained. In the case of slow drying, the individual domains of B coagulate.

The particular advantages of the photopolymerizable printing plates of the invention are convincingly manifested when they are used to produce relief printing plates, especially flexographic printing plates. There are two suitable production processes depending on the structure of the photopolymerizable printing plates. If the photopolymerizable printing plate does not include an IR-sensitive layer, then the structure of the relief printing plate is produced by laying on an image mask, followed by exposure to actinic radiation. If the photopolymerizable printing plate does include an IR-sensitive layer, then an image mask is not laid on but, instead, the IR-sensitive layer is structured imagewise using an IR laser so as to generate a mask on the photopolymerizable printing plate. Subsequently, the plate can be exposed conventionally with actinic light through the resultant mask.

In the case of exposure with the aid of a laid-on image mask, the production of the relief printing plates from the photopolymerizable printing plates of the invention customarily comprises the following specific operations:

a) optional, pretreatment of the recording materials of the invention, b) removal of the protective sheet, c) laying-on of an image mask or negative original, d) imagewise exposure of the photopolymerizable layer to actinic light having a wavelength of between 230 and 450 nm, in particular between 350 and 450 nm, e) washing-out (development) of the unexposed areas of the imagewise-exposed layer by means of suitable developers, with the unexposed areas of the top layer and the optionally present abhesive layer also being washed away, f) drying, g) optional, aftertreatment of the resultant relief printing plates, which now comprise or consist of the relief layer.

The thickness of the relief layer varies from 0.1 to 7 mm, in particular from 0.7 to 6.5 mm, depending on the intended use of the relief printing plates.

One customary method of pretreatment is the exposure of the recording material over its entire area to actinic light from the reverse. Here, reverse means that side which faces away from the relief layer that is formed subsequently.

Suitable sources of actinic light are commercial UV fluorescent tubes, medium, high and low pressure mercury lamps, superactinic fluorescent tubes, pulsed xenon lamps, lamps doped with metal iodides, and carbon arc lamps.

Examples of suitable developers are aliphatic and aromatic hydrocarbons, such as n-hexane, n-heptane, octane, petroleum ether, ligroin, limonene or other terpenes, toluene, xylene, ethylbenzene or isopropylbenzene, or mixtures of these solvents; ketones, such as acetone or methyl ethyl ketone; ethers, such as di-n-butyl ether; esters, such as ethyl acetate, halogenated aliphatic hydrocarbons, such as methylene chloride, chloroform, trichloroethanes, tetrachloroethylene, dichlorotetrafluoroethanes or trichlorotrifluoroethanes; or mixtures of two or more of these solvents; or mixtures of one or more of these solvents, and additionally, alcohols, such as methanol, ethanol, isopropanol or n-butanol; or solvents and mixtures of the type stated which additionally include solid, liquid or gaseous organic and inorganic compounds, such as surfactants, in minor amounts.

Conventional methods of aftertreatment of the relief images or printing plates are full-area postexposure to actinic light having a wavelength of between 150 and 450 nm, and treatment with halogen-containing solutions, especially bromine-containing solutions.

In the case of a photopolymerizable printing plate with IR-sensitive layer, the production of the relief printing plates from the photopolymerizable printing plates of the invention customarily comprises the following individual operations:

a) removal of the protective sheet, b) imagewise inscription of the IR-sensitive layer using an IR laser, c) optional, pretreatment of the recording materials of the invention, d) imagewise exposure of the photopolymerizable layer to actinic light having a wavelength of between 230 and 450 nm, in particular between 350 and 450 nm, e) washing-out (development) of the unexposed areas of the imagewise-exposed layer by means of suitable developers, with the residues of the IR-sensitive layer, the unexposed areas of the top layer and the optionally present abhesive layer also being washed away, f) drying, g) optional, aftertreatment of the resultant relief printing plates, which now comprise or consist of the relief layer.

The imagewise inscription of the IR-sensitive layer with an IR laser can take place judiciously on a drum on which the plate is mounted. The elastomeric nature of the IR-sensitive layer proves advantageous here, since it does not damage the surface of the plate stretched by mounting on the drum, as would be the case with a nonelastomeric layer.

It is also possible first to remove the residues of a water- or alcohol-soluble IR-sensitive layer using a water-based or water/alcohol-based developer and then to carry out the development of the imagewise-exposed layer using an organic developer. An advantage in this case is that the organic developer does not become contaminated with strongly coloring solids such as, for example, carbon black.

When the photopolymerizable printing plates of the invention are subjected to the appropriate process, a printing plate having fine indentations or ink cells in the surface of the printing relief is obtained: under the influence of the actinic radiation, photopolymerization is initiated in the photopolymerizable layer. If the top layer itself contains photoinitiator, the photopolymerization is initiated directly on that layer. Preferably, the top layer does not contain photoinitiator, and the photopolymerization of the top layer is initiated by the free radicals generated in the photopolymerizable layer lying directly below it. The two layers are therefore also linked to one another by chemical bonds. However, it is only the block copolymer A comprising vinylaromatic blocks and diene blocks, which still contains double bonds in the diene block, that is crosslinked. The block copolymer B comprising vinylaromatic blocks and alkylene blocks contains no double bonds and is not crosslinked. The domains of the block copolymer B that are present on the relief surface are washed out at the same time as the exposed plate is washed out, so that ink cells remain in the surface of the printing relief at this point. Only the B domains, completely surrounded by crosslinked and hence insoluble block copolymer A, remain in the fully hardened top layer.

In general, the ink cells in the printing relief have a diameter of 5–10 $\mu$m and a maximum depth of not more than 10 $\mu$m. In comparison to a printing plate without a top layer, the surface of the printing plate is very effectively detackified. The diameter of the ink cells can be regulated through an appropriate choice of solvent. In solvents such as methyl ethyl ketone, for example, which are able to swell the block copolymer B to a greater extent, larger domains of B and hence also larger-diameter ink cells are obtained than with not so strongly swelling solvents. The number of ink cells per unit area in the surface of the printing relief can be adjusted very simply by way of the ratio of the two block copolymers A and B. The greater the number of cells, the greater the roughness of the plate. It is therefore possible to set the printing-plate surface roughness required for a desired printing result in a simple manner without affecting typical flexo properties of the printing plate. More than 50% by weight of the uncrosslinkable block copolymer B should not be used, since at relatively high levels the top layer begins to become detached. Equally, not less than 5% by weight of B should be used, since otherwise it is no longer possible to detackify the printing surface. For the majority of flexographic applications an advantageous weight ratio A/B in the photopolymerizable printing plate is generally between 60:40 and 90:10, in particular between 70:30 and 85:15, in order to arrive at a relief printing plate having the optimum roughness.

A particular advantage of the printing plates of the invention is the outstanding ink acceptance and ink release. Because of the reduced surface tack, paper dust does not stick fast to the printing plate.

Following photopolymerization, the plates can also be developed with developers based on hydrocarbon solvents without the accumulation of sludge in the washers because of constituents which are insoluble in the developer.

The examples which follow are intended to illustrate the present invention without restricting its scope.

The surface tack of the printing plates was determined by measuring the pendulum tack using an Erichsen pendulum. The pendulum body consists of a semicircular cylinder which is able to roll back and forth on the surface to be tested. The pendulum is lowered onto the surface to be tested, swung up to a defined point and finally let go. The number of pendulum strokes is measured by means of a light barrier. For comparison, the number of strokes performed on a glass plate is measured.

EXAMPLE 1

Producing the Top Layer

In a stirring vessel with toothed disk dissolver a solution was prepared consisting of:

| Material: | Amount: | |
|---|---|---|
| Kraton ® D 1161 | 22.175% | (crosslinking block copolymer) |
| Kraton ® G 1652 | 5.54% | (noncrosslinking, hydrogenated block copolymer) |
| Kerobit ® TBK | 0.20% | |
| Sicodop ® Blue | 0.085% | |
| Toluene | 36.0% | |
| Xylene | 36.0% | |
| Kraton ® D 1161 = | SIS triblock elastomer; Shell Chemicals Europe | |
| Kraton ® G 1652 = | SEBS triblock elastomer, Shell Chemical Company, Houston, USA | |
| Kerobit ® TBK = | 1,5-di-tert-butyl-p-cresol (heat stabilizer, Raschig AG, Ludwigshafen) | |
| Sicodop ® Blue = | pigment preparation from BASF AG Ludwigshafen, copper phthalocyanine in dioctyl phthalate. | |

The solvents were introduced initially, the pigment preparation (Sicodop® Blue) and the stabilizer were added, and then Kraton® G 1652 was dissolved therein and, finally, Kraton® D 1161 was added. The entire mixture was then treated with the toothed disk dissolver at room temperature for 30 minutes. The resulting solution had a viscosity of 2980 mPas at 23° C.

The solution was cast onto a polyester film (PET) (Mylar® A, Du Pont Luxembourg, thickness 125 μm) coated with Macromelt® 6900 (polyamide from Henkel Corp., Minneapolis, USA, layer thickness 5 μm) at room temperature using a casting rule and, after passing through the drying zone, was wound up. In order to prevent the cast layer from sticking to the reverse of the polyester, a 36 μm siliconized PET film was applied by lamination as a release layer prior to winding (Perlasic® LF 36, Perlen Converting AG, Perlen, CH).

A layer assembly was obtained consisting of (1) 125 μm PET sheet (2) polyamide layer, (3) elastomeric top layer, and (4) siliconized PET film. The thickness of the dried elastomeric top layer was 70 μm.

Preparing the Photopolymerizable Mixture

A photosensitive mixture consisting of

| 74.97 parts | of styrene-isoprene-styrene triblock elastomer (Kraton ® D1161) |
| 5 parts | of α-methylstyrene-vinyltoluene copolymer (Piccotex ® 100, Hercules Inc., Wilmington, USA) |
| 5 parts | of hexanediol dimethacrylate |
| 5 parts | of hexanediol diacrylate |
| 7 parts | of paraffin oil (Weiβöl S 5000) |
| 1 part | of microcrystalline paraffin wax |
| 1 part | of benzil dimethyl ketal |
| 1 part | of Kerobit ® TBK |
| 0.03 part | of Sudan Orange liq. 183 | was extruded in a twin-screw extruder (ZSK 53) at a throughput of 30 kg/h, the temperature of the mixture during extrusion being 130° C., and was discharged through a slot die. The melt discharged from the die was passed into the nip of a two-roll calender. Both rolls were heated to 80° C.

Passed in over the upper calender roll was a 125 μm thick polyethylene terephthalate sheet (Mylar®) coated with an adhesion varnish, and the polyester film coated with the top layer was passed in over the lower calender roll, the laminated-on release film having been peeled from it by means of an automatic winder. Between the removal of the release film and the calender, the surface of the top layer was subjected to corona treatment (using a corona treatment station from Kalwar). The web width was 50 cm, the speed 60 cm/min, the calender nip 3000 μm. The resulting sandwich assembly was transported via a suction belt, cooled and subjected to final processing. The total thickness of the photopolymerizable printing plate including all sheets and films was 3010 μm.

Producing the Printing Plate

After a storage period of one week, the unprocessed plates were converted to printing plates by carrying out the following steps:

a. full-area reverse-side exposure to UV light (F III exposure unit, BASF, 35 s)

b. removal of the protective sheet c. laying-on of a nyloflex® FAR II test film (BASF)

d. main exposure under the vacuum film (F III exposure unit, 3–30 min in steps of 3 min)

e. washing-out of the plate (continuous flow system VFIII, BASF, flow-through speed 150 mm/min, developer (based on hydrocarbon solvents) nylosolv® II from BASF, 30° C., relief height 1000 μm)

f. drying for 2 hours at 65° C.

g. postexposure (UVA, F III exposure unit, 15 min)

h. aftertreatment with UVC light (F III aftertreatment unit, BASF, 15 min)

The test plate was evaluated. Assessment included the exposure time at which the positive test elements (free-standing dot 200 μm, grid 55 μm and the 2% tonal value screen field (60 L/cm) had been correctly formed on the plate. The time at which all positive elements were correctly formed is referred to as the lower exposure limit (LEL): the minimum exposure period for correct imaging.

Assessment also included the negative elements, i.e., the 400 μm negative dot and the 2000 μm groove. If the depth is below 70 μm in the negative dot or below 500 μm in the groove, proper ink transfer is no longer ensured. The time at which at least one of the two negative elements falls below these limits is referred to as the upper exposure limit (UEL): the maximum exposure period for a functional plate. The difference of UEL-LEL gives what is known as the exposure latitude (EL), which should be positive for proper functional application.

The values for the plate produced in the above example are as follows:

| | |
|---|---|
| 200 μm positive dot | 15 min |
| 55 μm grid | 18 min |
| 2% screen (60 L/cm) | 15 min |
| 400 μm negative dot | 27 min |
| 2000 μm groove | 24 min |
| LEL: | 18 min |
| UEL: | 24 min |
| EL: | 6 min |

In addition, the pendulum tack of the printing plate was determined using an Erichsen pendulum against glass as the reference:

| Subject of measurement | Pendulum strokes |
|---|---|
| Glass (reference) | 435 |
| Printing plate without top layer (Nyloflex ® FAR II, BASF) | 62 |
| Example 1 | 134 |

It was possible to achieve a marked reduction in surface tack in comparison with a printing plate without an upper layer. The print quality in the halftone (screen) region is much better than with a printing plate without a top layer. The plate shows a more sharply defined print, a lower tonal gain (increase in tonal value), and softer transitions.

The results are summarized in Table 1.

EXAMPLE 2

The procedure of Example 1 is repeated but using a perylene pigment (Paliogenrot®) instead of a copper phthalocyanine pigment to color the top layer.

For the top layer, a pigment preparation was prepared in toluenic rubber solution.

This was done by mixing

| | |
|---|---|
| 13 | parts of Paliogenrot ® EC 7265 |
| 12.1 | parts of Kraton ® D1161 and |
| 74.9 | parts of toluene, | which following the addition of glass beads (diameter 3–4 mm, 210 ml/kg dispersion), was dispersed on a roller bed for 4 hours, cooled and separated from the grinding media by pouring through a 1 mm sieve (mill base recovery 90%). This gave a very stable and fine pigment dispersion for the coloring of the top layer.

Top layers were produced and processed as in Example 1.

| Material: | Amount: |
|---|---|
| Kraton ® D 1161 | 21.66% |
| Kraton ® G 1652 | 5.54% |
| Kerobit ® TBK | 0.20% |
| Paliogenrot ® disp. | 0.60% (13% solids content) |
| Toluene | 36.0% |
| Xylene | 36.0% |

The top layer was processed as in Example 1 to give a photopolymerizable printing plate which was exposed and processed to give a print-ready plate. As in Example 1, the exposure latitude and the tack were determined. The results are summarized in Table 1.

EXAMPLES 3–5

(Coloring with Polymer Dyes)

The procedure of Example 1 was repeated but using different polymeric, lightfast azo dyes (Reactint®, Milliken) for coloring instead of a copper phthalocyanine pigment.

Table 1 summarizes the results of the experiments.

EXAMPLE 6

The procedure of Example 1 was repeated but using a binder of higher molecular weight (Kraton® G 1650) as the noncrosslinking binder 2. The results are summarized in Table 1.

EXAMPLES 7–10

Comparative Examples 1–3
(Surface Roughness)

The procedure of Example 1 was repeated but the ratio of SIS rubber (Kraton® D1161) to SEBS rubber (Kraton® G1652) was changed. The tack and roughness of each of the resulting printing plates was measured.

In terms of printing and abhesion, the ratio 80:20 was found to be the optimum. If SIS rubber is used, the surface becomes too tacky again. At very high SEBS contents (>50%) there are instances of detachment of the top layer, since the layer no longer adheres properly to the surface of the photopolymer.

The results are summarized in Table 2.

Comparative Examples 4–9

The procedure of Example 1 was repeated but using various non-hydrogenated SIS or SBS rubbers as binder 2. With none of these binders was it possible to obtain a tack-free surface. The results are summarized in Table 3.

TABLE 1

Properties of various printing plates produced with block copolymers containing alkylene units as binder B

| Ex. No. | Binder A | Binder B Description | Binder B Type | Dye Type | Dye Amount | LEL [min] | UEL [min] | EL [min] | Notes |
|---|---|---|---|---|---|---|---|---|---|
| 1 | SIS Kraton ® D1161 | SEBS | Kraton ® G1652 | Copper phthalocyanine* | 0.085% | 18 | 24 | +6 | tack-free, matt |

TABLE 1-continued

Properties of various printing plates produced with block copolymers containing alkylene units as binder B

| Ex. No. | Binder A | Binder B Description | Type | Dye Type | Amount | LEL [min] | UEL [min] | EL [min] | Notes |
|---|---|---|---|---|---|---|---|---|---|
| 2 | SIS Kraton ® D1161 | SEBS | Kranton ® G1652 | Paliogenrot** | 0.60% | 15 | >30 | >+15 | tack-free, matt |
| 3 | SIS Kraton ® D1161 | SEBS | Kraton ® G1652 | Polymeric azo dye Reactint ® Red*** X 64 | 1.00% | 6 | 9 | 3 | tack-free, low-level of dye migration |
| 4 | SIS Kraton ® D1161 | SEBS | Kraton ® G1652 | Polymeric Reactint ® Blue*** X3LV | 1.00% 1.00% | 6 6 | 15 15 | 9 9 | tack-free, no dye migration |
| 5 | SIS Kraton ® D1161 | SEBS | Kraton ® G1652 | Polymeric azo dye Reactint ® Blue*** X3LV | 2.00% | 6 | 18 | 12 | tack-free, no dye migration |
| 6 | SIS Kraton ® D1161 | SEBS, higher molecular weight | Kraton ® G1650 | Copper phthalocyanine* | 0.085% | 20 | 22 | +2 | tack-free, matt |

*Sicodop ® Blue = pigment preparation, BASF AG, Ludwiggshafen, copper phthalocyanine in dioctyl phthalate
**Paligenrot ® EC 7265 (BASF)
*** from Milliken

TABLE 2

Surface properties of various printing plates as a function of the ratio of binder A to binder B

| No. | Binder A/Binder B SIS (Kraton ® D1161)/ SEBS (Kraton ® G1652) | Surface roughness $R_z$ [μm] | Notes |
|---|---|---|---|
| Comparative Example 1 | 60:40 | | Detachment of the top layer from the photopolymerizable layer |
| Example 7 | 50:50 | 50.3 | tack-free |
| Example 8 | 65:35 | 29.3 | tack-free |
| Example 9 | 70:30 | 21.1 | tack-free |
| Example 10 | 80:20 | 12.9 | tack-free |
| Comparative Example 2 | 85:15 | 12.7 | slightly tacky |
| Comparative Example 3 | 100:0 | 4.8 | no abhesion |

TABLE 3

Properties of various printing plates produced with crosslinkable polymers as binder B. The dye used was in each case copper phthalocyanine in an amount of 0.085% by weight.

| Comparative Example No. | Binder 1 | Binder 2 Description | Type | LEL [min] | UEL [min] | EL [min] | Notes |
|---|---|---|---|---|---|---|---|
| C4 | Kraton ® D1161 | SBS, linear | Kraton ® D 1101 | >30 | 15 | >−15 | no abhesion |
| C5 | Kraton ® D1161 | SIS, linear | Kraton ® D 1117 | 24 | >30 | >6 | no abhesion |
| C6 | Kraton ® D1161 | SIS, linear, 40% diblock | Kraton ® | 30 | 21 | >−9 | no abhesion |

TABLE 3-continued

Properties of various printing plates produced with crosslinkable polymers as binder B.
The dye used was in each case copper phthalocyanine in an amount of 0.085% by weight.

| Comparative Example No. | Binder 1 | Binder 2 Description | Binder 2 Type | LEL [min] | UEL [min] | EL [min] | Notes |
|---|---|---|---|---|---|---|---|
| C7 | Kraton ® D1161 | SBS, radial | Kraton ® D 1116 | 27 | 18 | −9 | no abhesion |
| C8 | Kraton ® D1161 | SBS, radial, 10% diblock | Kraton ® D 1122X | 27 | 9 | −18 | no abhesion |
| C9 | Kraton ® D1161 | SIS | Kraton ® D 1300X | 24 | >30 | >+6 | no abhesion |

The examples show that only with block copolymers having saturated alkylene blocks as binder B is it possible to obtain printing plates having a tack-free surface and a positive exposure latitude. The best result is given by the SEBS binder Kraton® G 1652 used in Example 1. By altering the ratio of block copolymer A with diene block to block copolymer B with alkylene block it is possible in a simple manner to adjust the roughness of the surface of the printing plate.

The top layer can be colored either with color pigments or with dyes. The use of polymeric dyes is particularly advantageous, it being possible therewith to obtain particularly rapid plates, i.e. plates combining short exposure times with good exposure latitudes.

We claim:

1. A photopolymerizable printing plate comprising a dimensionally stable layer support, a photopolymerizable layer, an elastomeric top layer applied thereon, a protective sheet, and optionally, a transparent abhesive layer between said top layer and said protective sheet,
   wherein said elastomeric top layer comprises
      40–95% by weight of a crosslinkable elastomeric block copolymer A comprising vinylaromatic blocks and diene blocks, and
      5–50% by weight of a noncrosslinkable elastomeric block copolymer B comprising vinylaromatic blocks and alkylene blocks,
   and the block copolymers A and B are mutually incompatible.

2. A photopolymerizable printing plate as claimed in claim 1, further carrying, between said protective sheet and said top layer or said optional transparent abhesive layer, an IR-ablatable layer having high absorption in the wavelength range between 750 and 20,000 nm and an optical density in the actinic region of at least 2.5.

3. A process for producing a relief printing plate, which comprises, after having removed the protective sheet, subjecting the IR-ablatable layer of a photopolymerizable printing plate as claimed in claim 2 to imagewise structuring using an IR laser, so producing a mask on the photopolymerizable layer, then subjecting the plate to imagewise exposure with actinic light, and, after exposure, developing the plate by washing out the unexposed layer regions with a developer.

4. A photopolymerizable printing plate as claimed in claim 1, wherein said elastomeric block copolymer A consists of polystyrene blocks and polybutadiene blocks or polyisoprene blocks.

5. A photopolymerizable printing plate as claimed in claim 1, wherein said elastomeric block copolymer B consists of polystyrene blocks and polyethylene/butylene blocks or polyethylene/propylene blocks.

6. A photopolymerizable printing plate as claimed in claim 1, wherein said elastomeric top layer comprises a migration-stable dye or a migration-stable color pigment.

7. A process for producing a photopolymerizable printing plate as claimed in claim 1, which comprises performing the following steps:
   dissolving said elastomeric block copolymers A and B and, if desired, further constituents in an organic solvent,
   pouring this solution onto a protective sheet coated with an abhesive layer and, optionally, with an IR-ablative layer,
   evaporating the solvent mixture so that the two elastomeric block copolymers separate, and
   applying the layer assembly thus produced to a photopolymerizable layer on said dimensionally stable support.

8. A process for producing a photopolymerizable printing plate as claimed in claim 7, wherein said organic solvent is a mixture comprising toluene and xylene.

9. A process for producing a relief printing plate, which comprises covering a photopolymerizable printing plate as claimed in claim 1 with a film mask after having removed the protective sheet, subjecting the masked plate to imagewise exposure with actinic light, and, following exposure, developing the plate by washing out the unexposed layer regions with a developer.

10. A relief printing plate produced as claimed in claim 1, wherein ink cells are located in the surface of the relief.

11. A relief printing plate as claimed in claim 10, wherein said ink cells have a diameter of not more than 10 μm and a depth of not more than 10 μm.

* * * * *